(12) United States Patent
Melanson (10) Patent No.: US 7,969,125 B2
(45) Date of Patent: Jun. 28, 2011

(54) PROGRAMMABLE POWER CONTROL SYSTEM

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 448 days.

(21) Appl. No.: 11/967,275

(22) Filed: Dec. 31, 2007

(65) Prior Publication Data

US 2008/0272747 A1 Nov. 6, 2008

Related U.S. Application Data (60) Provisional application No. 60/915,547, filed on May 2, 2007.

(51) Int. Cl.
*G05F 1/00* (2006.01)

(52) U.S. Cl. ...................................... 323/222

(58) Field of Classification Search .................. 323/205, 323/282–283, 222, 284; 363/21.01, 21.02, 363/39; 341/143; 315/247
See application file for complete search history.

(56) References Cited

U.S. PATENT DOCUMENTS

| | | |
|---|---|---|
| 3,316,495 A | 4/1967 | Sherer |
| 3,423,689 A | 1/1969 | Miller et al. |
| 3,586,988 A | 6/1971 | Weekes |
| 3,725,804 A | 4/1973 | Langan |
| 3,790,878 A | 2/1974 | Brokaw |
| 3,881,167 A | 4/1975 | Pelton et al. |
| 4,075,701 A | 2/1978 | Hofmann |
| 4,334,250 A | 6/1982 | Theus |
| 4,414,493 A | 11/1983 | Henrich |
| 4,476,706 A | 10/1984 | Hadden et al. |
| 4,677,366 A | 6/1987 | Wilkinson et al. |
| 4,683,529 A | 7/1987 | Bucher |
| 4,700,188 A | 10/1987 | James |
| 4,737,658 A | 4/1988 | Kronmuller et al. |
| 4,797,633 A | 1/1989 | Humphrey |

(Continued)

FOREIGN PATENT DOCUMENTS

EP 0585789 A1 3/1994

(Continued)

OTHER PUBLICATIONS

INFINEON, CCM-PFC Standalone Power Factor Correction (PFC) Controller in Continuous Conduction Mode (CCM), Version 2.1, Feb. 6, 2007.

(Continued)

*Primary Examiner* — Adolf Berhane
*Assistant Examiner* — Yemane Mehari
(74) *Attorney, Agent, or Firm* — Hamilton & Terrile, LLP; Kent B. Chambers (57) ABSTRACT

A power control system includes a switching power converter and a programmable power factor correction (PFC) and output voltage controller. The programmable PFC and output voltage controller generates a control signal to control power factor correction and voltage regulation of the switching power converter. In at least one embodiment, the control signal is a pulse width modulated signal. The programmability of the PFC and output voltage controller provides the programmable PFC and output voltage controller flexibility to operate in accordance with programmable parameters, to adapt to various operating environments, and to respond to various operating exigencies. In at least one embodiment, the programmable PFC and output voltage controller includes a state machine to process one or more programmable, operational parameters to determine the period and pulse width states of the control signal.

22 Claims, 7 Drawing Sheets

U.S. PATENT DOCUMENTS

| | | | |
|---|---|---|---|
| 4,937,728 A | 6/1990 | Leonardi | |
| 4,940,929 A | 7/1990 | Williams | |
| 4,973,919 A | 11/1990 | Allfather | |
| 4,979,087 A | 12/1990 | Sellwood et al. | |
| 4,980,898 A | 12/1990 | Silvian | |
| 4,992,919 A | 2/1991 | Lee et al. | |
| 4,994,952 A | 2/1991 | Silva et al. | |
| 5,001,620 A | 3/1991 | Smith | |
| 5,109,185 A | 4/1992 | Ball | |
| 5,121,079 A | 6/1992 | Dargatz | |
| 5,206,540 A | 4/1993 | de Sa e Silva et al. | |
| 5,264,780 A | 11/1993 | Bruer et al. | |
| 5,278,490 A | 1/1994 | Smedley | |
| 5,323,157 A | 6/1994 | Ledzius et al. | |
| 5,359,180 A | 10/1994 | Park et al. | |
| 5,383,109 A | 1/1995 | Maksimovic et al. | |
| 5,424,932 A | 6/1995 | Inou et al. | |
| 5,477,481 A | 12/1995 | Kerth | |
| 5,479,333 A | 12/1995 | McCambridge et al. | |
| 5,481,178 A | 1/1996 | Wilcox et al. | |
| 5,565,761 A | 10/1996 | Hwang | |
| 5,589,759 A | 12/1996 | Borgato et al. | |
| 5,638,265 A | 6/1997 | Gabor | |
| 5,691,890 A | 11/1997 | Hyde | |
| 5,747,977 A | 5/1998 | Hwang | |
| 5,757,635 A | 5/1998 | Seong | |
| 5,764,039 A * | 6/1998 | Choi et al. | 323/222 |
| 5,781,040 A | 7/1998 | Myers | |
| 5,783,909 A | 7/1998 | Hochstein | |
| 5,798,635 A | 8/1998 | Hwang et al. | |
| 5,900,683 A | 5/1999 | Rinehart et al. | |
| 5,929,400 A | 7/1999 | Colby et al. | |
| 5,946,202 A | 8/1999 | Balogh | |
| 5,946,206 A | 8/1999 | Shimizu et al. | |
| 5,952,849 A | 9/1999 | Haigh et al. | |
| 5,960,207 A * | 9/1999 | Brown | 713/300 |
| 5,963,086 A | 10/1999 | Hall | |
| 5,966,297 A | 10/1999 | Minegishi | |
| 5,994,885 A | 11/1999 | Wilcox et al. | |
| 6,016,038 A | 1/2000 | Mueller et al. | |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,150,774 A | 11/2000 | Mueller et al. | |
| 6,181,114 B1 | 1/2001 | Hemena et al. | |
| 6,211,626 B1 | 4/2001 | Lys et al. | |
| 6,211,627 B1 | 4/2001 | Callahan | |
| 6,229,271 B1 | 5/2001 | Liu | |
| 6,229,292 B1 | 5/2001 | Redl et al. | |
| 6,246,183 B1 | 6/2001 | Buonavita | |
| 6,259,614 B1 | 7/2001 | Ribarich et al. | |
| 6,300,723 B1 | 10/2001 | Wang et al. | |
| 6,304,066 B1 | 10/2001 | Wilcox et al. | |
| 6,304,473 B1 | 10/2001 | Telefus et al. | |
| 6,343,026 B1 | 1/2002 | Perry | |
| 6,344,811 B1 | 2/2002 | Melanson | |
| 6,385,063 B1 | 5/2002 | Sadek et al. | |
| 6,407,691 B1 | 6/2002 | Yu | |
| 6,441,558 B1 | 8/2002 | Muthu et al. | |
| 6,445,600 B2 | 9/2002 | Ben-Yaakov | |
| 6,452,521 B1 | 9/2002 | Wang | |
| 6,469,484 B2 | 10/2002 | L'Hermite et al. | |
| 6,495,964 B1 | 12/2002 | Muthu et al. | |
| 6,509,913 B2 | 1/2003 | Martin, Jr. et al. | |
| 6,580,258 B2 | 6/2003 | Wilcox et al. | |
| 6,583,550 B2 | 6/2003 | Iwasa et al. | |
| 6,628,106 B1 | 9/2003 | Batarseh et al. | |
| 6,636,003 B2 | 10/2003 | Rahm et al. | |
| 6,646,848 B2 | 11/2003 | Yoshida et al. | |
| 6,688,753 B2 | 2/2004 | Calon et al. | |
| 6,713,974 B2 | 3/2004 | Patchornik et al. | |
| 6,724,174 B1 | 4/2004 | Esteves et al. | |
| 6,727,832 B1 | 4/2004 | Melanson | |
| 6,737,845 B2 | 5/2004 | Hwang | |
| 6,741,123 B1 | 5/2004 | Melanson et al. | |
| 6,753,661 B2 | 6/2004 | Muthu et al. | |
| 6,756,772 B2 | 6/2004 | McGinnis | |
| 6,768,655 B1 | 7/2004 | Yang et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,839,247 B1 | 1/2005 | Yang | |
| 6,860,628 B2 | 3/2005 | Robertson et al. | |
| 6,870,325 B2 | 3/2005 | Bushell et al. | |
| 6,873,065 B2 | 3/2005 | Haigh et al. | |
| 6,882,552 B2 | 4/2005 | Telefus et al. | |
| 6,888,322 B2 | 5/2005 | Dowling et al. | |
| 6,894,471 B2 | 5/2005 | Corva et al. | |
| 6,933,706 B2 | 8/2005 | Shih | |
| 6,940,733 B2 | 9/2005 | Schie et al. | |
| 6,944,034 B1 | 9/2005 | Shytenberg et al. | |
| 6,956,750 B1 | 10/2005 | Eason et al. | |
| 6,958,920 B2 | 10/2005 | Mednik et al. | |
| 6,963,496 B2 | 11/2005 | Bimbaud | |
| 6,967,448 B2 | 11/2005 | Morgan et al. | |
| 6,970,503 B1 | 11/2005 | Kalb | |
| 6,975,079 B2 | 12/2005 | Lys et al. | |
| 6,975,523 B2 | 12/2005 | Kim et al. | |
| 6,980,446 B2 | 12/2005 | Simada et al. | |
| 7,003,023 B2 | 2/2006 | Krone et al. | |
| 7,034,611 B2 | 4/2006 | Oswal et al. | |
| 7,050,509 B2 | 5/2006 | Krone et al. | |
| 7,064,498 B2 | 6/2006 | Dowling et al. | |
| 7,064,531 B1 | 6/2006 | Zinn | |
| 7,075,329 B2 | 7/2006 | Chen et al. | |
| 7,078,963 B1 | 7/2006 | Andersen et al. | |
| 7,088,059 B2 | 8/2006 | McKinney et al. | |
| 7,102,902 B1 | 9/2006 | Brown et al. | |
| 7,106,603 B1 | 9/2006 | Lin et al. | |
| 7,109,791 B1 | 9/2006 | Epperson et al. | |
| 7,126,288 B2 * | 10/2006 | Ribarich et al. | 315/308 |
| 7,135,824 B2 | 11/2006 | Lys et al. | |
| 7,145,295 B1 | 12/2006 | Lee et al. | |
| 7,158,633 B1 | 1/2007 | Hein | |
| 7,161,816 B2 | 1/2007 | Shytenberg et al. | |
| 7,183,957 B1 | 2/2007 | Melanson | |
| 7,221,130 B2 | 5/2007 | Ribeiro et al. | |
| 7,233,135 B2 | 6/2007 | Noma et al. | |
| 7,246,919 B2 | 7/2007 | Porchia et al. | |
| 7,255,457 B2 | 8/2007 | Ducharm et al. | |
| 7,266,001 B1 | 9/2007 | Notohamiprodjo et al. | |
| 7,288,902 B1 | 10/2007 | Melanson | |
| 7,292,013 B1 | 11/2007 | Chen et al. | |
| 7,310,244 B2 | 12/2007 | Yang et al. | |
| 7,345,458 B2 | 3/2008 | Kanai et al. | |
| 7,375,476 B2 | 5/2008 | Walter et al. | |
| 7,388,764 B2 | 6/2008 | Huynh et al. | |
| 7,394,210 B2 | 7/2008 | Ashdown | |
| 7,511,437 B2 * | 3/2009 | Lys et al. | 315/307 |
| 7,538,499 B2 | 5/2009 | Ashdown | |
| 7,545,130 B2 | 6/2009 | Latham | |
| 7,554,473 B2 | 6/2009 | Melanson | |
| 7,569,996 B2 | 8/2009 | Holmes et al. | |
| 7,583,136 B2 | 9/2009 | Pelly | |
| 7,656,103 B2 | 2/2010 | Shteynberg et al. | |
| 7,667,986 B2 * | 2/2010 | Artusi et al. | 363/16 |
| 7,710,047 B2 | 5/2010 | Shteynberg et al. | |
| 7,719,248 B1 | 5/2010 | Melanson | |
| 7,746,043 B2 | 6/2010 | Melanson | |
| 7,746,671 B2 | 6/2010 | Radecker et al. | |
| 7,750,738 B2 | 7/2010 | Bach | |
| 7,804,256 B2 | 9/2010 | Melanson | |
| 2002/0145041 A1 | 10/2002 | Muthu et al. | |
| 2002/0150151 A1 | 10/2002 | Krone et al. | |
| 2002/0166073 A1 | 11/2002 | Nguyen et al. | |
| 2003/0095013 A1 | 5/2003 | Melanson et al. | |
| 2003/0174520 A1 | 9/2003 | Bimbaud | |
| 2003/0223255 A1 | 12/2003 | Ben-Yaakov | |
| 2004/0004465 A1 | 1/2004 | McGinnis | |
| 2004/0046683 A1 | 3/2004 | Mitamura et al. | |
| 2004/0085030 A1 | 5/2004 | Laflamme et al. | |
| 2004/0085117 A1 | 5/2004 | Melbert et al. | |
| 2004/0169477 A1 | 9/2004 | Yancie et al. | |
| 2004/0227571 A1 | 11/2004 | Kuribayashi | |
| 2004/0228116 A1 | 11/2004 | Miller et al. | |
| 2004/0232971 A1 | 11/2004 | Kawasake et al. | |

| | | | |
|---|---|---|---|
| 2004/0239262 | A1 | 12/2004 | Ido et al. |
| 2005/0057237 | A1 | 3/2005 | Clavel |
| 2005/0156770 | A1 | 7/2005 | Melanson |
| 2005/0168492 | A1 | 8/2005 | Hekstra et al. |
| 2005/0184895 | A1 | 8/2005 | Petersen et al. |
| 2005/0207190 | A1 | 9/2005 | Gritter |
| 2005/0218838 | A1 | 10/2005 | Lys |
| 2005/0253533 | A1 | 11/2005 | Lys et al. |
| 2005/0270813 | A1 | 12/2005 | Zhang et al. |
| 2005/0275354 | A1 | 12/2005 | Hausman, Jr. et al. |
| 2005/0275386 | A1 | 12/2005 | Jepsen et al. |
| 2006/0022916 | A1 | 2/2006 | Aiello |
| 2006/0023002 | A1 | 2/2006 | Hara et al. |
| 2006/0125420 | A1 | 6/2006 | Boone et al. |
| 2006/0214603 | A1 | 9/2006 | Oh et al. |
| 2006/0226795 | A1 | 10/2006 | Walter et al. |
| 2006/0238136 | A1 | 10/2006 | Johnson, III et al. |
| 2006/0261754 | A1 | 11/2006 | Lee |
| 2006/0285365 | A1 | 12/2006 | Huynh et al. |
| 2007/0024213 | A1 | 2/2007 | Shteynberg et al. |
| 2007/0029946 | A1 | 2/2007 | Yu et al. |
| 2007/0040512 | A1 | 2/2007 | Jungwirth et al. |
| 2007/0053182 | A1 | 3/2007 | Robertson |
| 2007/0103949 | A1 | 5/2007 | Tsuruya |
| 2007/0124615 | A1* | 5/2007 | Orr .............................. 713/300 |
| 2007/0182699 | A1 | 8/2007 | Ha et al. |
| 2008/0012502 | A1 | 1/2008 | Lys |
| 2008/0043504 | A1 | 2/2008 | Ye et al. |
| 2008/0054815 | A1 | 3/2008 | Kotikalapoodi et al. |
| 2008/0130322 | A1* | 6/2008 | Artusi et al. ............... 363/21.01 |
| 2008/0174291 | A1 | 7/2008 | Hansson et al. |
| 2008/0174372 | A1 | 7/2008 | Tucker et al. |
| 2008/0175029 | A1 | 7/2008 | Jung et al. |
| 2008/0192509 | A1 | 8/2008 | Dhuyvetter et al. |
| 2008/0224635 | A1 | 9/2008 | Hayes |
| 2008/0232141 | A1* | 9/2008 | Artusi et al. ............... 363/21.01 |
| 2008/0239764 | A1 | 10/2008 | Jacques et al. |
| 2008/0259655 | A1 | 10/2008 | Wei et al. |
| 2008/0278132 | A1 | 11/2008 | Kesterson et al. |
| 2009/0067204 | A1 | 3/2009 | Ye et al. |
| 2009/0147544 | A1 | 6/2009 | Melanson |
| 2009/0174479 | A1 | 7/2009 | Yan et al. |
| 2009/0218960 | A1 | 9/2009 | Lyons et al. |

FOREIGN PATENT DOCUMENTS

| | | | |
|---|---|---|---|
| EP | 0910168 | A1 | 4/1999 |
| EP | 1014563 | | 6/2000 |
| EP | 1164819 | A | 12/2001 |
| EP | 1213823 | A2 | 6/2002 |
| EP | 1528785 | A | 5/2005 |
| EP | 2204905 | A1 | 7/2010 |
| GB | 2069269 | A | 8/1981 |
| JP | WO 2006/022107 | A2 | 3/2006 |
| WO | 01/15316 | A1 | 1/2001 |
| WO | 01/97384 | A | 12/2001 |
| WO | 02/15386 | A2 | 2/2002 |
| WO | 0227944 | | 4/2002 |
| WO | 02/091805 | A2 | 11/2002 |
| WO | WO2006013557 | | 2/2006 |
| WO | 2006/067521 | A | 6/2006 |
| WO | WO2006135584 | | 12/2006 |
| WO | 2007/026170 | A | 3/2007 |
| WO | 2007/079362 | A | 7/2007 |

OTHER PUBLICATIONS

International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al, International Rectifier, Bridgeless PFC Implementation Using One Cycle Control Technique, 2005.
Linear Technology, LT1248, Power Factor Controller, Apr. 20, 2007.
On Semiconductor, AND8123/D, Power Factor Correction Stages Operating in Critical Conduction Mode, Sep. 2003.
On Semiconductor, MC33260, GreenLine Compact Power Factor Controller: Innovative Circuit for Cost Effective Solutions, Sep. 2005.
On Semiconductor, NCP1605, Enhanced, High Voltage and Efficient Standby Mode, Power Factor Controller, Feb. 2007.
On Semconductor, NCP1606, Cost Effective Power Factor Controller, Mar. 2007.
On Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
Stmicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al., An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEETransactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13-18, 2002.

Q. Li et al., An Analysis of the ZVS Two-Inductor Boost Converter under Variable Frequency Operation, IEEE Transactions on Power Electronics, vol. 22, No. 1, Jan. 2007.
H. Peng et al., Modeling of Quantization Effects in Digitally Controlled DC-DC Converters, IEEE Transactions on Power Electronics, vol. 22, No. 1, Jan. 2007.
G. Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 AND A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.
D.K.W. Cheng et al., A New Improved Boost Converter with Ripple Free Input Current Using Coupled Inductors, Power Electronics and Variable Speed Drives, Sep. 21-23, 1998.
B.A. Miwa et al., High Efficiency Power Factor Correction Using Interleaved Techniques, Applied Power Electronics Conference and Exposition, Seventh Annual Conference Proceedings, Feb. 23-27, 1992.
Z. Lai et al., A Family of Power-Factor-Correction Controllers, Twelfth Annual Applied Power Electronics Conference and Exposition, vol. 1, Feb. 23-27, 1997.
L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7-11, 1993.
Fairchild Semiconductor, Application Note 42030, Theory and Application of the ML4821 Average Current Mode PFC Controller, Oct. 25, 2000.
Unitrode Products From Texas Instruments, BiCMOS Power Factor Preregulator, Feb. 2006.
AN-H52 Application Note: "HV9931 Unity Power Factor LED Lamp Driver" Mar. 7, 2007, Supertex Inc., Sunnyvale, CA, USA.
Dustin Rand et al: "Issues, Models and Solutions for Triac Modulated Phase Dimming of LED Lamps" Power Electronics Specialists Conferrence, 2007. PESC 2007. IEEE, IEEE, P1, Jun. 1, 2007, pp. 1398-1404.
Spiazzi G et al: "Analysis of a High-Power Factor Electronic Ballast for High Brightness Light Emitting Diodes" Power Electronics Specialists, 2005 IEEE 36th Conference on Jun. 12, 2005, Piscatawa, NJ, USA, IEEE, Jun. 12, 2005, pp. 1494-1499.
International Search Report PCT/US2008/062381 dated Feb. 5, 2008.
International Search Report PCT/US2008/056739 dated Dec. 3, 2008.
Written Opinion of the International Searching Authority PCT/US2008/062381 dated Feb. 5, 2008.
Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.
International Search Report PCT/US2008/062398 dated Feb. 5, 2008.
Partial International Search Report PCT/US2008/062387 dated Feb. 5, 2008.
Noon, Jim "UC3855A/B High Performance Power Factor Preregulator", Texas Instruments, SLUA146A, May 1996, Revised Apr. 2004.
International Search Report PCT/GB2006/003259 dated Jan. 12, 2007.
Written Opinion of the International Searching Authority PCT/US2008/056739 dated Dec. 3, 2008.
International Search Report PCT/US2008/056606 dated Dec. 3, 2008.
Written Opinion of the International Searching Authority PCT/US2008/056606 dated Dec. 3, 2008.
International Search Report PCT/US2008/056608 dated Dec. 3, 2008.
Written Opinion of the International Searching Authority PCT/US2008/056608 dated Dec. 3, 2008.
International Search Report PCT/GB2005/050228 dated Mar. 14, 2006.
International Search Report PCT/US2008/062387 dated Jan. 10, 2008.
Data Sheet LT3496 Triple Output LED Driver, Linear Technology Corporation, Milpitas, CA 2007.
Linear Technology, News Release,Triple Output LED, LT3496, Linear Technology, Milpitas, CA, May 24, 2007.
Freescale Semiconductor, Inc., Dimmable Light Ballast with Power Factor Correction, Design Reference Manual, DRM067, Rev. 1, Dec. 2005.
J. Zhou et al., Novel Sampling Algorithm for DSP Controlled 2 kW PFC Converter, IEEE Transactions on Power Electronics, vol. 16, No. 2, Mar. 2001.
A. Prodic, Compensator Design and Stability Assessment for Fast Voltage Loops of Power Factor Correction Rectifiers, IEEE Transactions on Power Electronics, vol. 22, No. 5, Sep. 2007.
M. Brkovic et al., "Automatic Current Shaper with Fast Output Regulation and Soft-Switching," S.15.C Power Converters, Telecommunications Energy Conference, 1993.
Dallas Semiconductor, Maxim, "Charge-Pump and Step-Up DC-DC Converter Solutions for Powering White LEDs in Series or Parallel Connections," Apr. 23, 2002.
Freescale Semiconductor, AN3052, Implementing PFC Average Current Mode Control Using the MC9S12E128, Nov. 2005.
D. Maksimovic et al., "Switching Converters with Wide DC Conversion Range," Institute of Electrical and Electronic Engineer's (IEEE) Transactions on Power Electronics, Jan. 1991.
V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.
S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.
K. Leung et al., "Use of State Trajectory Prediction in Hysteresis Control for Achieving Fast Transient Response of The Buck Converter," Circuits and Systems, 2003. ISCAS apos;03. Proceedings of the 2003 International Symposium, vol. 3, Issue , May 25-28, 2003 pp. III-439-III-442 vol. 3.
K. Leung et al., "Dynamic Hysteresis Band Control of the Buck Converter with Fast Transient Response," IEEE Transactions on Circuits and Systems—II: Express Briefs, vol. 52, No. 7, Jul. 2005.
Y. Ohno, Spectral Design Considerations for White LED Color Rendering, Final Manuscript, Optical Engineering, vol. 44, 111302 (2005).
S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.
J. Turchi, Four Key Steps to Design a Continuous Conduction Mode PFC Stage Using the NCP1653, ON Semiconductor, Publication Order No. AND184/D, Nov. 2004.
Megaman, D or S Dimming ESL, Product News, Mar. 15, 2007.
J. Qian et al., New Charge Pump Power-Factor-Correction Electronic Ballast with a Wide Range of Line Input Voltage, IEEE Transactions on Power Electronics, vol. 14, No. 1, Jan. 1999.
P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.
J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.
S. Chan et al., Design and Implementation of Dimmable Electronic Ballast Based on Integrated Inductor, IEEE Transactions on Power Electronics, vol. 22, No. 1, Jan. 2007.
M. Madigan et al., Integrated High-Quality Rectifier-Regulators, IEEE Transactions on Industrial Electronics, vol. 46, No. 4, Aug. 1999.
T. Wu et al., Single-Stage Electronic Ballast with Dimming Feature and Unity Power Factor, IEEE Transactions on Power Electronics, vol. 13, No. 3, May 1998.
F. Tao et al., "Single-Stage Power-Factor-Correction Electronic Ballast with a Wide Continuous Dimming Control for Fluorescent Lamps," IEEE Power Electronics Specialists Conference, vol. 2, 2001.
Azoteq, IQS17 Family, IQ Switch® —ProxSense™ Series, Touch Sensor, Load Control and User Interface, IQS17 Datasheet V2.00.doc, Jan. 2007.
C. Dilouie, Introducing the LED Driver, EC&M, Sep. 2004.
S. Lee et al., TRIAC Dimmable Ballast with Power Equalization, IEEE Transactions on Power Electronics, vol. 20, No. 6, Nov. 2005.
L. Gonthier et al., EN55015 Compliant 500W Dimmer with Low-Losses Symmetrical Switches, 2005 European Conference on Power Electronics and Applications, Sep. 2005.
Why Different Dimming Ranges? The Difference Between Measured and Perceived Light, http://www.lutron.com/ballast/pdf/LutronBallastpg3.pdf.
D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.
Light Dimmer Circuits, www.epanorama.net/documents/lights/lightdimmer.html, printed Mar. 26, 2007.
Light Emitting Diode, http://en.wikipedia.org/wiki/Light-emitting_diode, printed Mar. 27, 2007.
Color Temperature, www.sizes.com/units/color_temperature.htm, printed Mar. 27, 2007.
S. Lee et al., A Novel Electrode Power Profiler for Dimmable Ballasts Using DC Link Voltage and Switching Frequency Controls, IEEE Transactions on Power Electronics, vol. 19, No. 3, May 2004.
Y. Ji et al., Compatibility Testing of Fluorescent Lamp and Ballast Systems, IEEE Transactions on Industry Applications, vol. 35, No. 6, Nov./Dec. 1999.
National Lighting Product Information Program, Specifier Reports, "Dimming Electronic Ballasts," vol. 7, No. 3, Oct. 1999.
Supertex Inc., Buck-based LED Drivers Using the HV9910B, Application Note AN-H48, Dec. 28, 2007.
D. Rand et al., Issues, Models and Solutions for Triac Modulated Phase Dimming of LED Lamps, Power Electronics Specialists Conference, 2007.
Supertex Inc., HV9931 Unity Power Factor LED Lamp Driver, Application Note AN-H52, Mar. 7, 2007.
Supertex Inc., 56W Off-line LED Driver, 120VAC with PFC, 160V, 350mA Load, Dimmer Switch Compatible, DN-H05, Feb. 2007.
ST Microelectronics, Power Factor Corrector L6561, Jun. 2004.
Fairchild Semiconductor, Application Note 42047 Power Factor Correction (PFC) Basics, Rev. 0.9.0 Aug. 19, 2004.
M. Radecker et al., Application of Single-Transistor Smart-Power IC for Fluorescent Lamp Ballast, Thirty-Fourth Annual Industry Applications Conference IEEE, vol. 1, Oct. 3-7, 1999.
M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.
Fairchild Semiconductor, FAN4800, Low Start-up Current PFC/PWM Controller Combos, Nov. 2006.
Fairchild Semiconductor, FAN4810, Power Factor Correction Controller, Sep. 24, 2003.
Fairchild Semiconductor, FAN4822, ZVS Average Current PFC Controller, Aug. 10, 2001.
Fairchild Semiconductor, FAN7527B, Power Factor Correction Controller, 2003.
Fairchild Semiconductor, ML4821, Power Factor Controller, Jun. 19, 2001.
Freescale Semiconductor, AN1965, Design of Indirect Power Factor Correction Using 56F800/E, Jul. 2005.
International Search Report for PCT/US2008/051072, mailed Jun. 4, 2008.
D. Hausman, Lutron, RTISS-TE Operation, Real-Time Illumination Stability Systems for Trailing-Edge (Reverse Phase Control) Dimmers, v. 1.0 Dec. 2004.
International Rectifier, Data Sheet No. PD60230 revC, IR1150(S)(PbF), uPFC One Cycle Control PFC IC Feb. 5, 2007.
Texas Instruments, Application Report SLUA308, UCC3817 Current Sense Transformer Evaluation, Feb. 2004.
Texas Instruments, Application Report SPRA902A, Average Current Mode Controlled Power Factor Correctiom Converter using TMS320LF2407A, Jul. 2005.
Unitrode, Design Note DN-39E, Optimizing Performance in UC3854 Power Factor Correction Applications, Nov. 1994.
Fairchild Semiconductor, Application Note 42030, Theory and Application of the ML4821 Average Currrent Mode PFC Controller, Aug. 1997.
Fairchild Semiconductor, Application Note AN4121, Design of Power Factor Correction Circuit Using FAN7527B, Rev.1.0.1, May 30, 2002.
Fairchild Semiconductor, Application Note 6004, 500W Power-Factor-Corrected (PFC) Converter Design with FAN4810, Rev. 1.0.1, Oct. 31, 2003.
Fairchild Semiconductor, FAN4822, ZVA Average Current PFC Controller, Rev. 1.0.1 Aug. 10, 2001.
Fairchild Semiconductor, ML4821, Power Factor Controller, Rev. 1.0.2, Jun. 19, 2001.
Fairchild Semiconductor, ML4812, Power Factor Controller, Rev. 1.0.4, May 31, 2001.
Linear Technology, 100 Watt LED Driver, undated.
Fairchild Semiconductor, FAN7544, Simple Ballast Controller, Rev. 1.0.0.
Fairchild Semiconductor, FAN7532, Ballast Controller, Rev. 1.0.2.
Fairchild Semiconductor, FAN7711, Ballast Control IC, Rev. 1.0.2.
Fairchild Semiconductor, KA7541, Simple Ballast Controller, Rev. 1.0.3.
ST Microelectronics, L6574, CFL/TL Ballast Driver Preheat and Dimming, Sep. 2003.
ST Microelectronics, AN993, Application Note, Electronic Ballast with PFC Using L6574 and L6561, May 2004.
Power Integrations, Inc., "TOP200-4/14 TOPSwitch Family Three-terminal Off-line PWM Switch", XP-002524650, Jul. 1996, Sunnyvale, California.
Texas Instruments, SLOS318F, "High-Speed, Low Noise, Fully-Differential I/O Amplifiers," THS4130 and THS4131, US, Jan. 2006.
International Search Report and Written Opinion, PCT US20080062387, dated Feb. 5, 2008.
International Search Report and Written Opinion, PCT US200900032358, dated Jan. 29, 2009.
Hirota, Atsushi et al, "Analysis of Single Switch Delta-Sigma Modulated Pulse Space Modulation PFC Converter Effectively Using Switching Power Device," IEEE, US, 2002.
Prodic, Aleksandar, "Digital Controller for High-Frequency Rectifiers with Power Factor Correction Suitable for On-Chip Implementation," IEEE, US, 2007.
International Search Report and Written Opinion, PCT US20080062378, dated Feb. 5, 2008.
International Search Report and Written Opinion, PCT US20090032351, dated Jan. 29, 2009.
Erickson, Robert W. et al, "Fundamentals of Power Electronics," Second Edition, Chapter 6, Boulder, CO, 2001.
Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.
Texas Instruments, SLUS828B, "8-Pin Continuous Conduction Mode (CCM) PFC Controller", UCC28019A, US, revised Apr. 2009.

Analog Devices, "120 kHz Bandwidth, Low Distortion, Isolation Amplifier", AD215, Norwood, MA, 1996.
Burr-Brown, ISO120 and ISO121, "Precision Los Cost Isolation Amplifier," Tucson AZ, Mar. 1992.
Burr-Brown, ISO130, "High IMR, Low Cost Isolation Amplifier," SBOS220, US, Oct. 2001.
International Search Report and Written Report PCT US20080062428 dated Feb. 5, 2008.
Prodic, A. et al, "Dead Zone Digital Controller for Improved Dynamic Response of Power Factor Preregulators," IEEE, 2003.
"HV9931 Unity Power Factor LED Lamp Driver, Initial Release" 2005, Supertex Inc., Sunnyvale, CA USA.
AN-H52 Application Note: "HV9931 Unity Power Factor LED Lamp Driver" Mar. 7, 2007, Supertex Inc., Sunnyvale, CA, USA.
Dustin Rand et al: "Issues, Models and Solutions for Triac Modulated Phase Dimming of LED Lamps" Power Electronics Specialists Conference, 2007. PESC 2007, IEEE, IEEE, P1, Jun. 1, 2007, pp. 1398-1404.
Spiazzi G et al: "Analysis of a High-Power-Factor Electronic Ballast for High Brightness Light Emitting Diodes" Power Electronics Specialists, 2005 IEEE 36th Conference on Jun. 12, 2005, Piscatawa, NJ USA, IEEE, Jun. 12, 2005, pp. 1494-1499.
Written Opinion of the International Searching Authority PCT/US2008/062381 dated Feb. 5, 2008.
Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.
Partial International Search PCT/US2008/062387 dated Feb. 5, 2008.
Noon, Jim "UC3855A/B High Performance Power Factor Preregulator", Texas Instruments, SLUA146A, May 1996, Revised Apr. 2004.
"High Performance Power Factor Preregulator", Unitrode Products from Texas Instruments, SLUS382B, Jun. 1998, Revised Oct. 2005.
Written Opinion of the International Searching Authority PCT/US2008/056739.
Written Opinion of the International Searching Authority PCT/US2008/056606 dated Dec. 3, 2008.
Written Opinion of the International Searching Authority PCT/US2008/056608 dated Dec. 3, 2008.
International Search PCT/US2008/062387 dated Jan. 10, 2008.
Data Sheet LT3496 Triple Output LED Driver, 2007, Linear Technology Corporation, Milpitas, CA.
News Release, Triple Output LED, LT3496.
Linear Technology, "Single Switch PWM Controller with Auxiliary Boost Converter," LT1950 Datasheet, Linear Technology, Inc. Milpitas, CA, 2003.
Yu, Zhenyu, 3.3V DSP for Digital Motor Control, Texas Instruments, Application Report SPRA550 dated Jun. 1999.
International Rectifier, Data Sheet No. PD60143-O, Current Sensing Single Channel Driver, El Segundo, CA, dated Sep. 8, 2004.
Balogh, Laszlo, "Design and Application Guide for High Speed MOSFET Gate Drive Circuits" [Online] 2001, Texas Instruments, Inc., SEM-1400, Unitrode Power Supply Design Seminar, Topic II, TI literature No. SLUP133, XP002552367, Retrieved from the Internet: URL:htt://focus.ti.com/lit/ml/slup169/slup169.pdf the whole document.
ST Datasheet L6562, Transition-Mode PFC Controller, 2005, STMicroelectronics, Geneva, Switzerland.
Maksimovic, Regan Zane and Robert Erickson, Impact of Digital Control in Power Electronics, Proceedings of 2004 International Symposium on Power Semiconductor Devices & Ics, Kitakyushu, , Apr. 5, 2010, Colorado Power Electronics Center, ECE Department, University of Colorado, Boulder, CO.
Texas Instruments, Interleaving Continuous Conduction Mode PFC Controller, UCC28070, SLUS794C, Nov. 2007, revised Jun. 2009, Texas Instruments, Dallas TX.
Mamano, Bob, "Current Sensing Solutions for Power Supply Designers", Unitrode Seminar Notes SEM1200, 1999.
http://toolbarpdf.com/docs/functions-and-features-of-inverters.html printed on Jan. 20, 2011.
International Search Report and Written Opinion for PCT/US2008/062384 dated Jan. 14, 2008.
S. Dunlap et al., Design of Delta-Sigma Modulated Switching Power Supply, Circuits & Systems, Proceedings of the 1998 IEEE International Symposium, 1998.

* cited by examiner

PROGRAMMABLE POWER CONTROL SYSTEM

CROSS-REFERENCE TO RELATED APPLICATION

This application claims the benefit under 35 U.S.C. §119 (e) and 37 C.F.R. §1.78 of U.S. Provisional Application No. 60/915,547, filed May 2, 2007, and entitled "Power Factor Correction (PFC) Controller Apparatuses and Methods," and is incorporated by reference in its entirety.

BACKGROUND OF THE INVENTION

1. Field of the Invention

The present invention relates in general to the field of signal processing, and, more specifically, to a programmable power control system.

2. Description of the Related Art

Many electronic systems utilize nonlinear processes to generate output signals. For example, plant systems, such as servo control systems and power conversion systems, often utilize nonlinear processes. Power control systems often utilize a switching power converter to convert alternating current (AC) voltages to direct current (DC) voltages or DC-to-DC. Power control systems provide power factor corrected and regulated output voltages to many devices that utilize a regulated output voltage.

Figure 1:
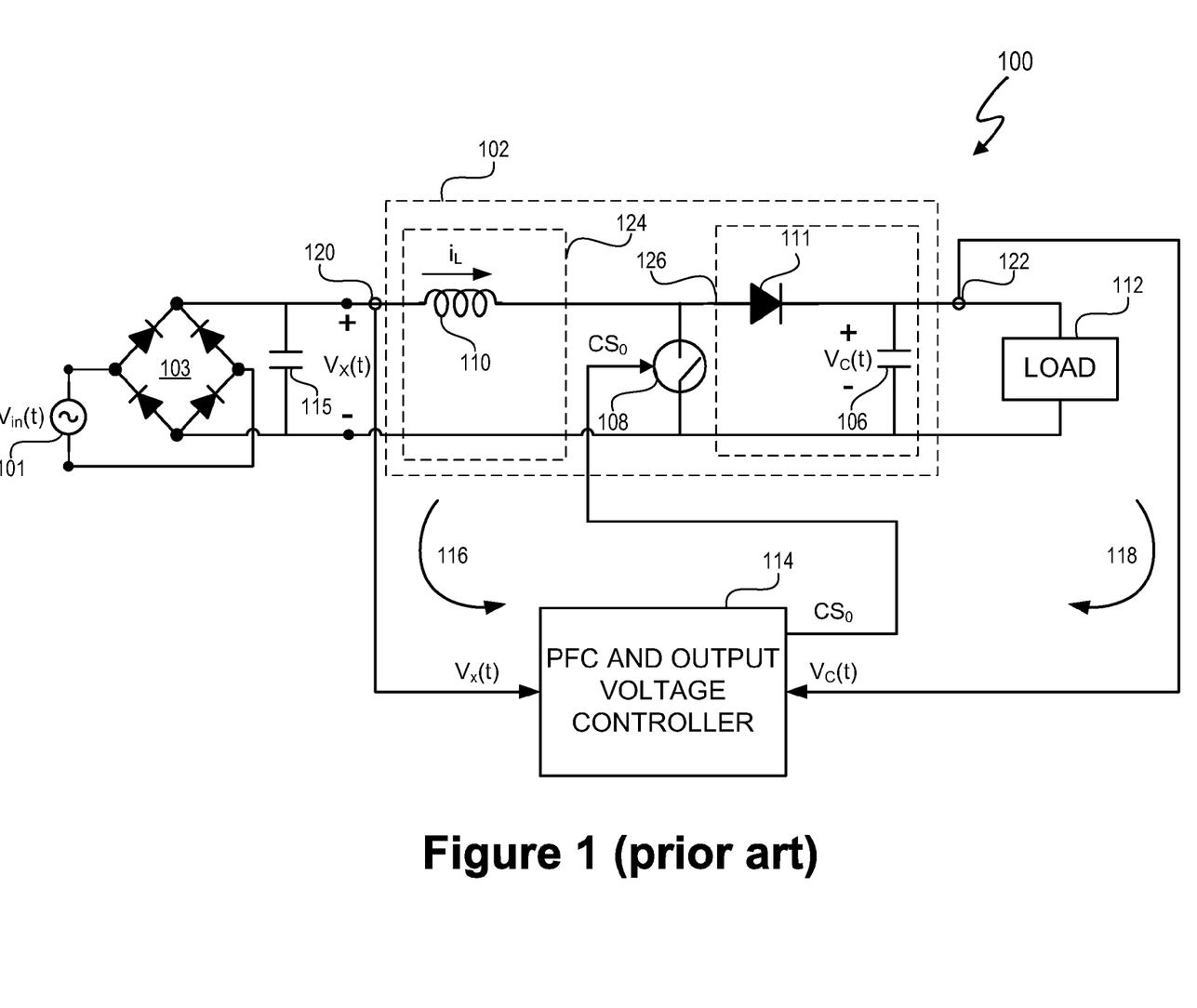
FIG. 1 (labeled prior art) depicts a power control system.

FIG. 1 represents a power control system 100, which includes a switching power converter 102. Voltage source 101 supplies an alternating current (AC) input voltage $V_{in}(t)$ to a full, diode bridge rectifier 103. The voltage source 101 is, for example, a public utility, and the AC voltage $V_{in}(t)$ is, for example, a 60 Hz/110 V line voltage in the United States of America or a 50 Hz/220 V line voltage in Europe. The rectifier 103 rectifies the input voltage $V_{in}(t)$ and supplies a rectified, time-varying, line input voltage $V_x(t)$ to the switching power converter.

The switching power converter 102 includes power factor correction (PFC) stage 124 and driver stage 126. The PFC stage 124 is controlled by switch 108 and provides power factor correction. The driver stage 126 is also controlled by switch 108 and regulates the transfer of energy from the line input voltage $V_x(t)$ through inductor 110 to capacitor 106. The inductor current $i_L$ ramps 'up' when the switch 108 conducts, i.e. is "ON". The inductor current $i_L$ ramps down when switch 108 is nonconductive, i.e. is "OFF", and supplies current $i_L$ to recharge capacitor 106. The time period during which inductor current $i_L$ ramps down is commonly referred to as the "inductor flyback time". Diode 111 prevents reverse current flow into inductor 110. In at least one embodiment, the switching power converter 102 operates in discontinuous current mode, i.e. the inductor current $i_L$ ramp up time plus the inductor flyback time is less than the period of switch 108.

Input current $i_L$ is proportionate to the 'on-time' of switch 108, and the energy transferred to inductor 110 is proportionate to the 'on-time' squared. Thus, the energy transfer process is one embodiment of a nonlinear process. In at least one embodiment, control signal $CS_0$ is a pulse width modulated signal, and the switch 108 is an n-channel field effect transistor that conducts when the pulse width of $CS_0$ is high. Thus, the 'on-time' of switch 108 is determined by the pulse width of control signal $CS_0$. Accordingly, the energy transferred to inductor 110 is proportionate to a square of the pulse width of control signal $CS_0$.

Capacitor 106 supplies stored energy to load 112. The capacitor 106 is sufficiently large so as to maintain a substantially constant output voltage $V_c(t)$, as established by a power factor correction (PFC) and output voltage controller 114 (as discussed in more detail below). The output voltage $V_c(t)$ remains substantially constant during constant load conditions. However, as load conditions change, the output voltage $V_c(t)$ changes. The PFC and output voltage controller 114 responds to the changes in $V_c(t)$ and adjusts the control signal $CS_0$ to resume a substantially constant output voltage as quickly as possible. The output voltage controller 114 includes a small capacitor 115 to filter any high frequency signals from the line input voltage $V_x(t)$.

The power control system 100 also includes a PFC and output voltage controller 114. PFC and output voltage controller 114 controls switch 108 and, thus, controls power factor correction and regulates output power of the switching power converter 102. The goal of power factor correction technology is to make the switching power converter 102 appear resistive to the voltage source 101. Thus, the PFC and output voltage controller 114 attempts to control the inductor current $i_L$ so that the average inductor current $i_L$ is linearly and directly related to the line input voltage $V_x(t)$. Prodić, *Compensator Design and Stability Assessment for Fast Voltage Loops of Power Factor Correction Rectifiers*, IEEE Transactions on Power Electronics, Vol. 22, No. 5, September 2007, pp. 1719-1729 (referred to herein as "Prodić"), describes an example of PFC and output voltage controller 114. The PFC and output voltage controller 114 supplies a pulse width modulated (PWM) control signal $CS_0$ to control the conductivity of switch 108. In at least one embodiment, switch 108 is a field effect transistor (FET), and control signal $CS_0$ is the gate voltage of switch 108. The values of the pulse width and duty cycle of control signal $CS_0$ depend on two feedback signals, namely, the line input voltage $V_x(t)$ and the capacitor voltage/output voltage $V_c(t)$.

PFC and output controller 114 receives two feedback signals, the line input voltage $V_x(t)$ and the output voltage $V_c(t)$, via a wide bandwidth current loop 116 and a slower voltage loop 118. The line input voltage $V_x(t)$ is sensed from node 120 between the diode rectifier 103 and inductor 110. The output voltage $V_c(t)$ is sensed from node 122 between diode 111 and load 112. The current loop 116 operates at a frequency $f_c$ that is sufficient to allow the PFC and output controller 114 to respond to changes in the line input voltage $V_x(t)$ and cause the inductor current $i_L$ to track the line input voltage to provide power factor correction. The current loop frequency is generally set to a value between 20 kHz and 100 kHz. The voltage loop 118 operates at a much slower frequency $f_v$, typically 10-20 Hz. By operating at 10-20 Hz, the voltage loop 118 functions as a low pass filter to filter an alternating current (AC) ripple component of the output voltage $V_c(t)$.

The PFC and output voltage controller 114 controls the pulse width (PW) and period (TT) of control signal $CS_0$. Thus, PFC and output voltage controller 114 controls the nonlinear process of switching power converter 102 so that a desired amount of energy is transferred to capacitor 106. The desired amount of energy depends upon the voltage and current requirements of load 112. To regulate the amount of energy transferred and maintain a power factor correction close to one, PFC and output voltage controller 114 varies the period of control signal $CS_0$ so that the input current $i_L$ tracks the changes in input voltage $V_x(t)$ and holds the output voltage $V_c(t)$ constant. Thus, as the input voltage $V_x(t)$ increases, PFC and output voltage controller 114 increases the period T of control signal $CS_0$, and as the input voltage $V_x(t)$ decreases, PFC and output voltage controller 114 decreases the period of control signal $CS_0$. At the same time, the pulse width PW of control signal $CS_0$ is adjusted to maintain a constant duty cycle (D) of controls signal $CS_0$, and, thus, hold the output voltage $V_C(t)$ constant. In at least one embodiment, the PFC and output voltage controller 114 updates the control signal $CS_0$ at a frequency much greater than the frequency of input voltage $V_x(t)$. The frequency of input voltage $V_x(t)$ is generally 50-60 Hz. The frequency 1/TT of control signal $CS_0$ is, for example, between 25 kHz and 100 kHz. Frequencies at or above 25 kHz avoid audio frequencies and frequencies at or below 100 kHz avoids significant switching inefficiencies while still maintaining good power factor correction, e.g. between 0.9 and 1, and an approximately constant output voltage $V_C(t)$.

Figure 2:
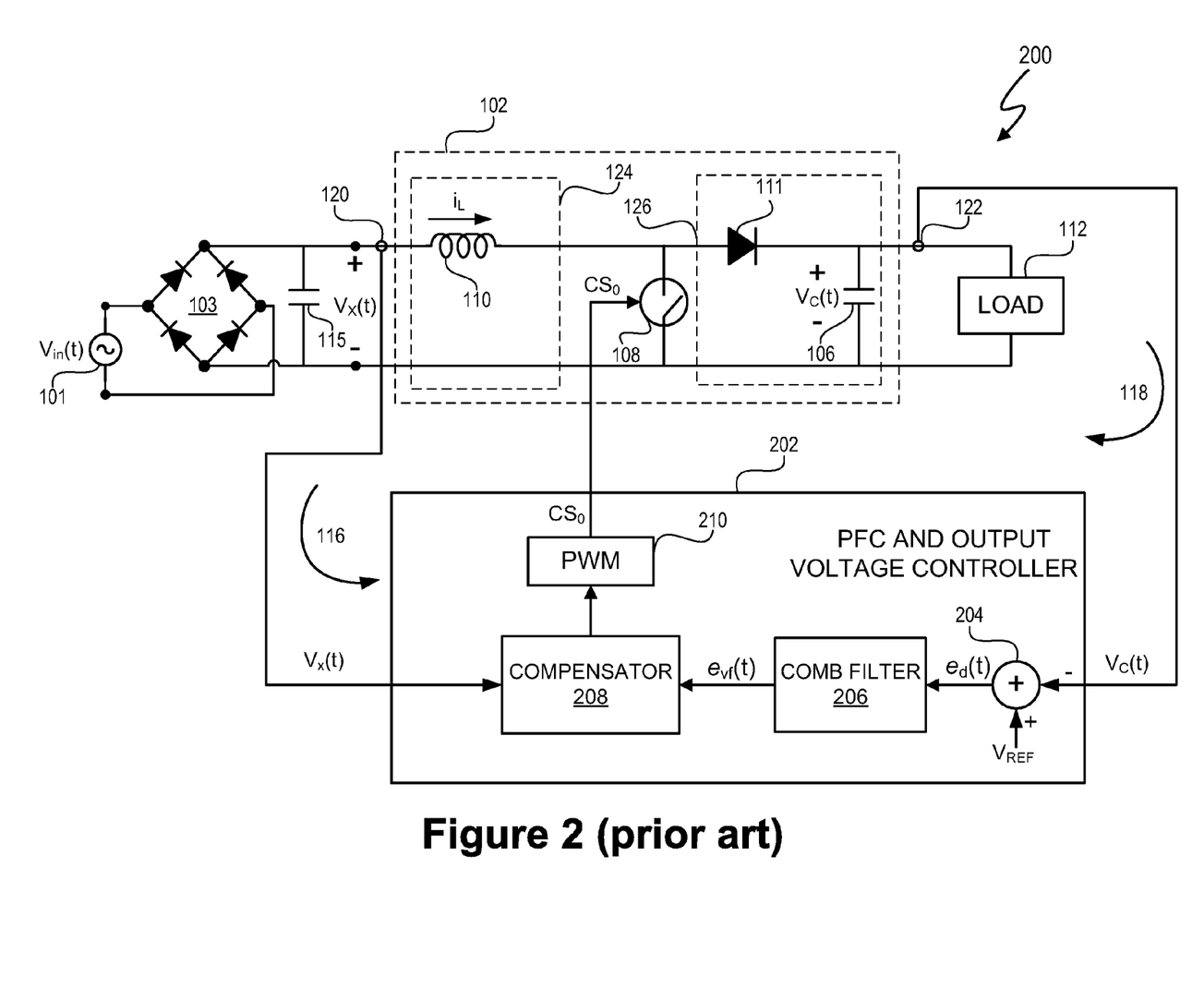
FIG. 2 (labeled prior art) depicts another embodiment of a power control system.

FIG. 2 depicts a generalized representation of a power control system 200 described in Prodić. The PFC and output voltage controller 202 of Prodić includes an error generator 204 to determine an error signal $e_d(t)$. The error signal $e_d(t)$ represents a difference between the output voltage $V_c(t)$ and a reference voltage $V_{REF}$. The reference voltage $V_{REF}$ is set to the desired value of output voltage $V_c(t)$. A comb filter 206 filters the error signal $e_d(t)$. The comb filter 206 has significant attenuation at equally spaced frequencies (referred to as "notches") and has unity gain at other frequencies. The comb filter 206 automatically tunes the notches to match twice the line frequency $f_L$ and harmonics of the line frequency. The line frequency $f_L$ is the frequency of input voltage $V_{in}(t)$. According to Prodić, the comb filter 206 generates a "ripple free" error signal $e_{vf}(t)$. Compensator 208 processes the filtered error signal, and input voltage feedback signal $V_x(t)$ generates a compensator output signal. The pulse width modulator (PWM) 210 processes the compensator output signal to generate control signal $CS_0$.

Power control systems 100 and 200 generate control signal $CS_0$ in accordance with fixed operational parameters to provide power factor correction and output voltage regulation for a particular input voltage $V_{in}(t)$, line frequency $f_L$, and output voltage $V_C(t)$. The operational parameters determine, for example, how to modify the control signal $CS_0$ in response to changes in the output voltage $V_c(t)$. The fixed operation parameters lack flexibility to adapt to various operating environments and respond to various operating exigencies.

SUMMARY OF THE INVENTION

In one embodiment of the present invention, a programmable power factor correction (PFC) controller to generate at least one control signal to control power factor correction of a power supply includes a memory to store one or more operational parameters of the PFC and output voltage controller. At least one operational parameter is a control state equation operational parameter to determine at least one of a period state and a pulse width state of a power factor correction control signal. The PFC and output voltage controller also includes a pulse width and period control processor, coupled to the memory, to access each operational parameter and use each operational parameter to generate period state and pulse state output signals to respectively control period and pulse width states of the control signal.

In another embodiment of the present invention, a method of generating at least one control signal to control power factor correction of a power supply includes accessing one or more operational parameters from a memory. At least one operational parameter is a control state equation operational parameter to determine at least one of a period state and a pulse width state of a power factor correction control signal. The method also includes using each operational parameter to generate period state and pulse state output signals to respectively control period and pulse width states of the control signal. The method further includes generating the control signal in accordance with the period state and pulse state output signals.

In a further embodiment of the present invention, an apparatus for generating at least one control signal to control power factor correction of a power supply includes means for accessing one or more operational parameters from a memory. At least one operational parameter is a control state equation operational parameter to determine at least one of a period state and a pulse width state of a power factor correction control signal. The apparatus also includes means for using each operational parameter to generate period state and pulse state output signals to respectively control period and pulse width states of the control signal. The apparatus further includes means for generating the control signal in accordance with the period state and pulse state output signals.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A power control system includes a switching power converter and a programmable power factor correction (PFC) and output voltage controller. The programmable PFC and output voltage controller generates a control signal to control power factor correction and voltage regulation of the switching power converter. In at least one embodiment, the control signal is a pulse width modulated signal. The programmability of the PFC and output voltage controller provides the programmable PFC and output voltage controller flexibility to operate in accordance with programmable parameters, to adapt to various operating environments, and to respond to various operating exigencies.

In at least one embodiment, the programmable PFC and output voltage controller includes a processor to process one or more programmable, configuration profile parameters to determine the period and pulse width states of the control signal. In at least one embodiment, the processor is a state machine. In at least one embodiment, a nonvolatile memory stores the operational parameters, and the state machine retrieves the configuration profile parameters during operation of the programmable PFC and output voltage controller. In at least one embodiment, the configuration profile parameters specify operational state conditions of the control signal such as minimum and maximum control signal frequencies, pulse skipping for low output power conditions, minimum pulse widths, responsiveness to external feedback, spreading of the control signal frequency spectrum. Other configuration profile parameters are associated with preprocessing operations that affect determination of the control signal.

Figure 3:
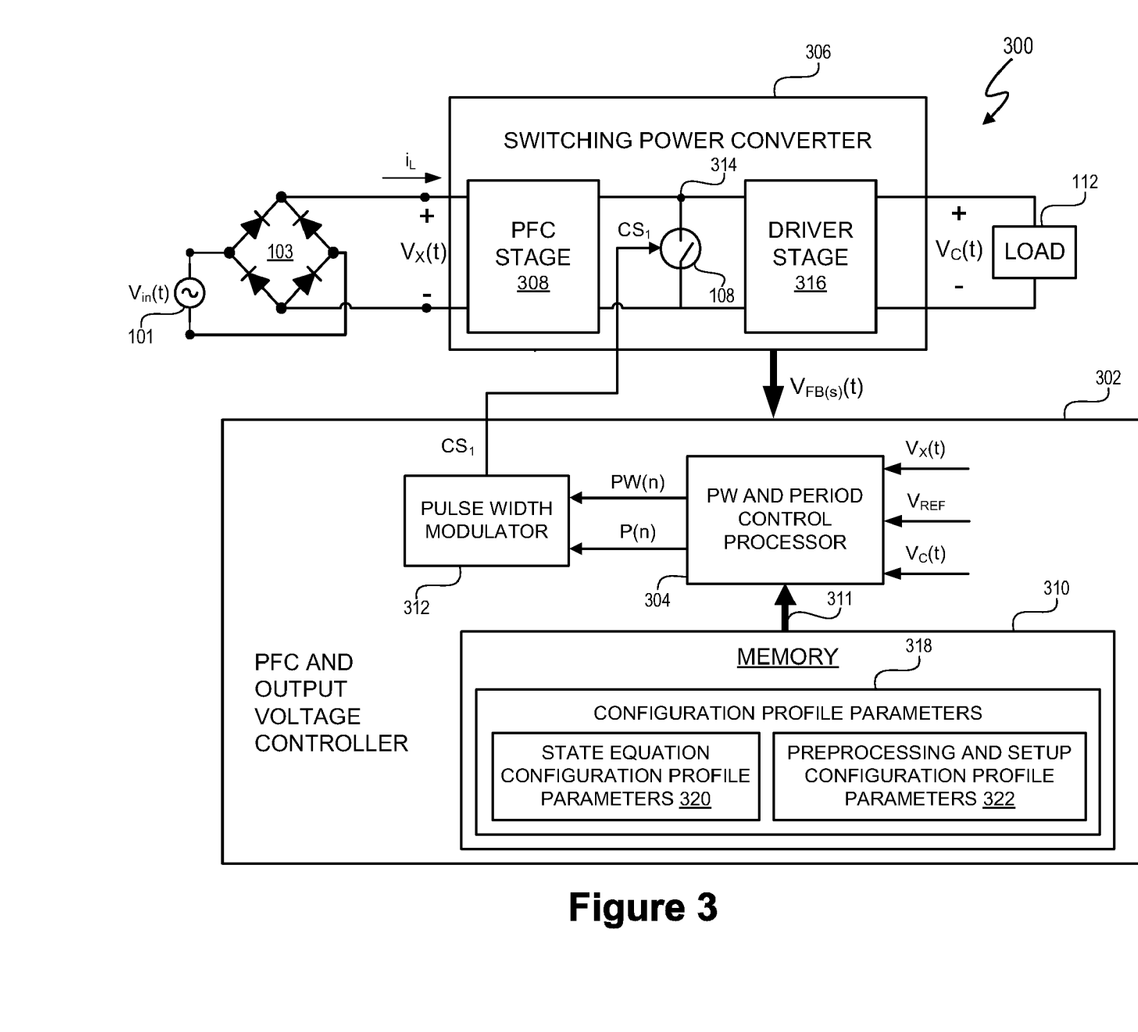
FIG. 3 depicts a power control system with a programmable PFC and output voltage controller.

FIG. 3 depicts power control system 300, and power control system 300 includes a programmable PFC and output voltage controller 302. The programmable PFC and output voltage controller 302 includes a pulse width (PW) and period control processor 304 to generate a pulse width state signal PW(n) and a period state signal P(n). In at least one embodiment, the pulse width state signal PW(n) and period state signal P(n) respectively specify the pulse width state and period state of control signal $CS_1$ for each cycle of control signal $CS_1$. In at least one embodiment, the PW and period control processor 304 is a state machine.

Switching power converter 306 includes a PFC stage 308 to provide power factor correction in accordance with control signal $CS_1$. The control signal $CS_1$ controls power factor correction by causing the inductor current $i_L$ to directly and linearly track changes in the line input voltage $V_x(t)$. In at least one embodiment, PFC stage 308 is identical to PFC stage 124. Switching power converter 306 also includes a driver stage 316 to provide an approximately constant voltage and, thus, approximately constant power to load 112 in accordance with control signal $CS_1$. The control signal $CS_1$ controls output voltage regulation by causing the output voltage $V_c(t)$ to track a reference voltage $V_{REF}$. In at least one embodiment, the reference voltage $V_{REF}$ is set to a desired output voltage of switching power converter 306. For example, a light emitting diode fixture may have a 400 V input voltage rating, and reference voltage $V_{REF}$ is set to 400 V. In at least one embodiment, the reference voltage $V_{REF}$ can be manually or automatically modified to account for differing power demands as, for example, load 112 changes. In at least one embodiment, driver stage 316 is identical to driver stage 126. Unless explicitly indicated otherwise, the term "approximately" represents a nearly exact or an exact match. A value is "nearly exact" if the value achieves acceptable performance.

Power control system 300 also includes a pulse width modulator 312 to generate the pulse width modulated control signal $CS_1$. Pulse width modulator 312 modifies the pulse width and period of control signal $CS_1$ in accordance with the pulse width state signal PW(n) and modifies the period of control signal $CS_1$ in accordance with period state signal P(n). In at least one embodiment, pulse width state signal PW(n) and period state signal P(n) are discrete, quantization output signals of respective delta-sigma modulators. Pulse width modulator 312 provides the control signal to switch 108, and control signal $CS_1$ controls the conductive state of switch 108. In at least one embodiment, switch 108 is a field effect transistor (FET), such as an n-channel, and control signal $CS_1$ is the gate voltage of switch 108.

The programmable PFC and output voltage controller 302 utilizes the line input voltage $V_x(t)$ and the output voltage $V_c(t)$ of switching power converter 306 to determine control signal $CS_1$. In at least one embodiment, feedback signal(s) $V_{FB(S)}(t)$ represents line input voltage $V_x(t)$, output voltage $V_c(t)$, a switch node voltage at switch node 314, or any combination thereof. In at least one embodiment, feedback signal $V_{FB(S)}(t)$ is a single feedback signal representing the voltage at the switch node 314. In this embodiment, the programmable PFC and output voltage controller 302 can determine both the line input voltage $V_x(t)$ and the output voltage $V_c(t)$ from the single feedback signal $V_{FB(S)}(t)$ as, for example, described in U.S. patent application Ser. No. 11/967,271 entitled "Power Factor Correction Controller With Feedback Reduction", inventor John L. Melanson, assignee Cirrus Logic, Inc., ("Melanson I") and U.S. patent application Ser. No. 11/967,272 entitled "Power Factor Correction Controller With Switch Node Feedback", inventor John L. Melanson, assignee Cirrus Logic, Inc. ("Melanson II"). The output signal $V_c(t)$ can be sampled directly as described in the exemplary embodiments of "Power Factor Correction Controller With Digital FIR Filter Output Voltage Sampling", inventor John L. Melanson, assignee Cirrus Logic, Inc., and Ser. No. 11/967,276 ("Melanson III") and "Power Supply Dc Voltage Offset Detector", inventor John L. Melanson, assignee Cirrus Logic, Inc., and Ser. No. 11/967,277 ("Melanson IV"). Melanson I, Melanson II, Melanson III, and Melanson IV are incorporated herein by reference in their entireties.

In at least one embodiment, each signal represented by feedback signal(s) $V_{FB(S)}(t)$ is scaled to a value that is useable by programmable PFC and output voltage controller 302 without damaging programmable PFC and output voltage controller 302. For example, in at least one embodiment, programmable PFC and output voltage controller 302 is implemented entirely as an integrated circuit or in combination with digital and/or analog components. The integrated circuit has a maximum input signal voltage. Accordingly, each feedback signal(s) $V_{FB(S)}(t)$ is scaled as, for example, described in Melanson I and Melanson II.

Memory 310 stores configuration profile parameters 318. In at least one embodiment, configuration profile parameters 318 include control signal state equation parameters 320 and preprocessing and setup configuration profile parameters 322. The PW and period control processor 304 accesses the configuration profile parameters via bus 311. The PW and period control processor 304 uses control signal state equation configuration profile parameters 320 to determine the period state and pulse width state of the control signal $CS_1$. In at least one embodiment, the state equation configuration profile parameters 320 determine the period and pulse width states of the control signal $CS_1$ if the configuration profile parameters 318 are used by PW and period control processor 304 in one or more control signal state equations to determine the period state, control state, or both period and control states of control signal $CS_1$. The PW and period control processor 304 also processes preprocessing and setup configuration profile parameters 322. Preprocessing and setup configuration profile parameters 322 affect the determination of control signal $CS_1$ but are not used directly by control signal state equations. Pre-processing configuration profile parameters 318 include operational parameters that process feedback signals, such as the input voltage $V_x(t)$ and the output voltage $V_c(t)$, in preparation for use by control signal state equations. Example preprocessing operational parameters include preprocessing filter parameters, such as filter coefficients, and proportional integrator gain parameters.

In at least one embodiment, memory 310 is a nonvolatile storage medium. Memory 310 can be, for example, a read/write or one time programmable memory type. How and when the PFC configuration profile parameters 318 are loaded into memory 310 is a design choice. In at least one embodiment, the configuration profile parameters 318 are loaded during manufacture of PW and period control processor 304. In another embodiment, configuration profile parameters 318 are initially loaded and/or updated by a user of PW and period control processor 304 such as a purchaser.

The particular configuration profile parameters 318 loaded and stored in memory 310 is also a matter of design choice. The PW and period control processor 304 determines the pulse width and period states of control signal $CS_1$ in accordance with one or more control signal state equations, such as Control Signal State Equations [1], [3], [4], and [5] indicated below. The control signal state equations utilize multiple parameters that can be varied to control the pulse width and period states of control signal $CS_1$. In at least one embodiment, the state equation configuration profile parameters 320 include one or more operational parameters to provide:

Minimum and maximum control state switching frequencies;
Minimum and maximum output voltage ranges;
Minimum and maximum pulse widths;
Control signal frequency spread spectrum strategy(ies);
Input under voltage protection; and
Control signal frequency adjustments for line input voltage $V_x(t)$ and output voltage $V_c(t)$ values.

In at least one embodiment, the pre-processing operational parameters 320 include one or more operational parameters to provide:

Proportional integrator gain factors;
Feedback variable scaling factors; and
Filter variables, such as the filter coefficients of Melanson III.

Figure 4:
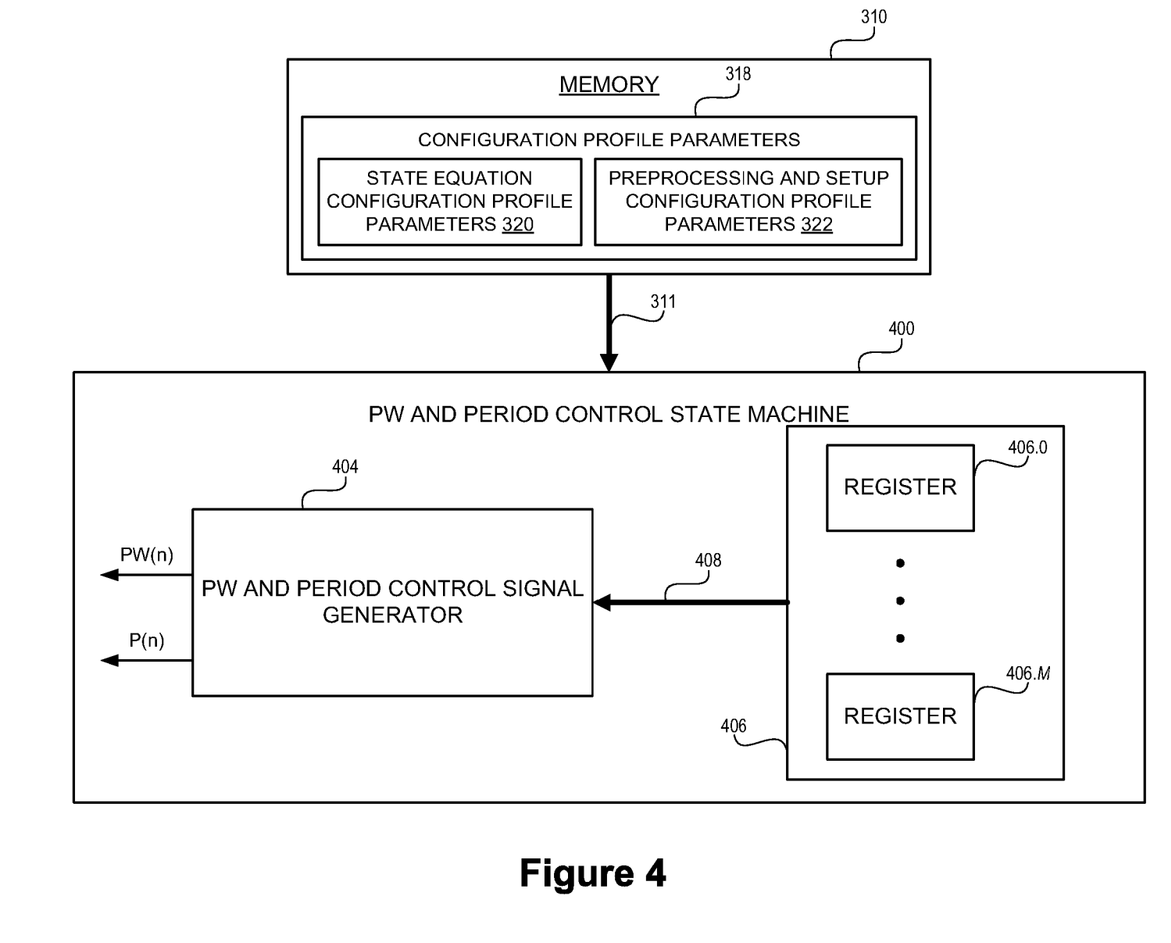
FIG. 4 depicts a memory with configuration profile parameters and a pulse width and period control state machine, and the state machine represents one embodiment of the PFC and output voltage controller of FIG. 3.

FIG. 4 depicts PW and period control state machine 400 connected to memory 310 via bus 311. The PW and period control state machine 400 represents one embodiment of PW and period control processor 304. In at least one embodiment, upon power-up of the programmable PFC and output voltage controller 302, the PW and period control state machine 400 loads the operational parameters 320 into operational parameter registers 406.0 through 406.M of the PW and period control state machine 400. M is an integer, and M-1 represents the total number of operational parameter registers. Operational parameter registers 406.0 through 406.M are collectively referred to as "registers 406". PW and period control signal generator 404 accesses the registers 406 via bus 408 and utilizes the contents of registers 406 in the generation of pulse width state signal PW(n) and period state signal P(n) for the generation of control signal $CS_1$.

Figure 5:
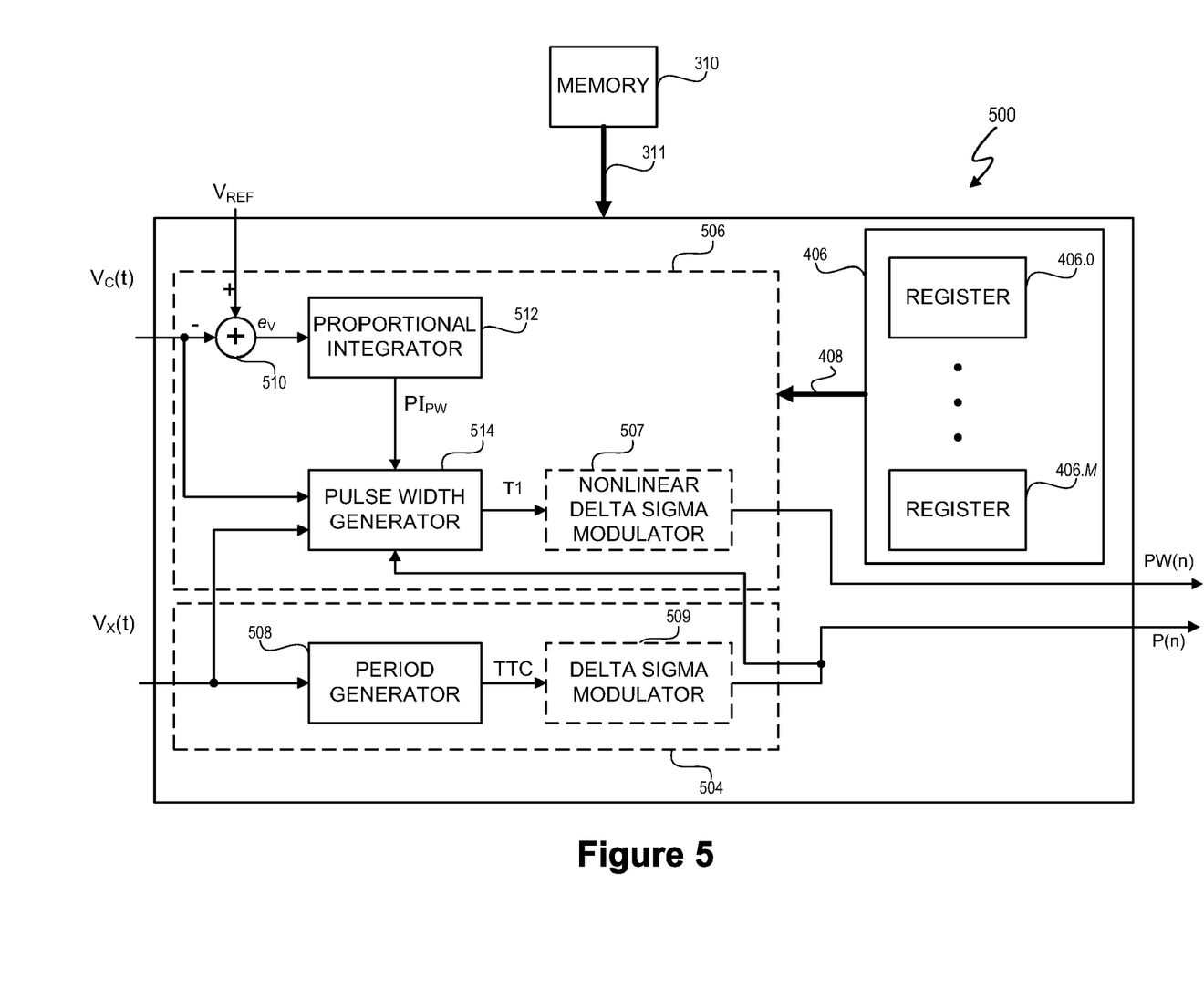
FIG. 5 depicts a pulse width control state machine that represents another embodiment of the PFC and output voltage controller of FIG. 3.

FIG. 5 depicts PW and period control state machine 500, which represents another embodiment of PW and period control processor 304. The PW and period control state machine 500 includes period control system 504 and pulse width control system 506 to respectively determine the period state and pulse width state of control signal $CS_1$. In at least one embodiment, the PW and period control state machine 500 updates control signal $CS_1$ at a frequency between 25 kHz and 150 kHz. Updating above 25 kHz avoids audible switching noises, and updating below 150 kHz results in a more efficient operation of switch 108.

The period control system 504 includes a period generator 508 to generate a period state signal P(n). The period state signal P(n) controls the period of control signal $CS_1$. In at least one embodiment, the period state signal P(n) is a 'free' variable and can be set by the period generator 508 within limits and in accordance with state equation configuration profile parameters 320. In at least one embodiment, the period generator 508 receives line input voltage $V_x(t)$ and output voltage $V_c(t)$, and period control system 504 generates period state signal P(n) in response to the value of line input voltage $V_x(t)$. In at least one embodiment, the line input voltage $V_x(t)$ is sampled to generate a discrete value for use by period generator 508.

In at least one embodiment, the period control system 504 also includes a delta-sigma modulator 509. The delta-sigma modulator 509 receives the period control signal TTC and generates a period state signal P(n). In this embodiment, the period state signal P(n) is an output of a quantizer (not shown) of delta-sigma modulator 509. The delta-sigma modulator 509 spectrally noise shapes the period control signal TTC. Spectral noise shaping reduces the influence of noise on the period control signal TTC and, thus, allows PW and period control state machine 500 to provide better power factor correction and output voltage regulation control for switching power converter 306. Exemplary conventional delta-sigma modulator design and operation is described in the book *Understanding Delta-Sigma Data Converters* by Schreier and Temes, IEEE Press, 2005, ISBN 0-471-46585-2. In at least one embodiment, the period control system 504 does not include the delta-sigma modulator 509, and the period generator 508 provides the period control signal TTC directly to the pulse width generator 514.

In at least one embodiment, the PW and period control state machine 500 accesses the configuration profile parameters 320 via bus 311 and loads one or more sets of configuration profile parameters 320 into registers 406. In at least one embodiment, the configuration profile parameters 320 loaded into registers 406 correspond to the particular configuration profile of PW and period control state machine 500. The period control system 504 accesses control signal state equation parameters 320 from one or more of registers 406 via bus 408. In at least one embodiment, the period control system 504 accesses operational parameters used to determine or set the period state of control signal $CS_1$, such as state equation configuration profile parameters 320 that indicate a minimum and a maximum frequency of control signal $CS_1$. The minimum and maximum frequencies can be set in accordance with any of a variety of goals, such as avoiding audio frequencies and avoiding inefficient switching frequencies. Thus, period control system 504 generates the period state signal P(n) within the minimum and maximum control signal frequency operational parameters. The minimum frequency of control signal $CS_1$, i.e. the maximum period indicated by period state signal P(n), can be set to avoid audio frequencies, and the maximum frequency of control signal $CS_1$, i.e. the minimum period indicated by period state signal P(n), can be set to avoid switching inefficiencies by switch 108. Additionally, the control state equation parameters can also indicate frequencies to avoid. For example, 40 kHz is often used by infrared remote controls. Thus, in a lighting application, period control system 504 avoids control signal $CS_1$ frequencies that would cause a light, such as a light emitting diode, to switch 'on' and 'off' at 40 kHz or any other interfering frequency. The minimum and maximum frequency operational parameters can be identical to provide fixed frequency operation of control signal $CS_1$. In at least one embodiment, higher frequencies of control signal $CS_1$ provide better power factor correction. Thus, the minimum frequency operational parameter can be set so that the switching power converter 306 meets power factor correction standards where the switching power converter 306 operates.

Figure 7:
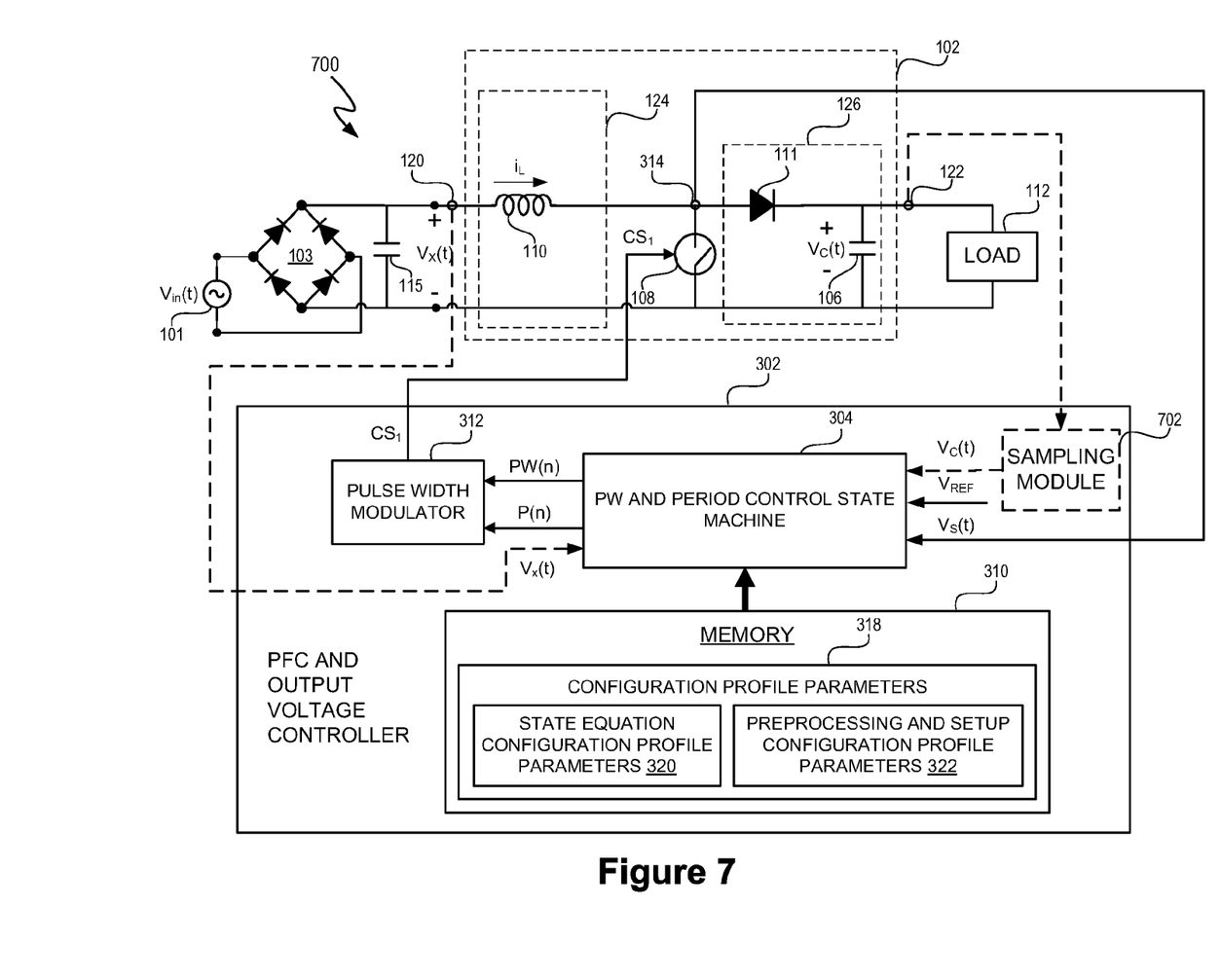
FIG. 7 depicts an embodiment of the power control system of FIG. 3.

Different inductor values of an exemplary PFC stage 308, such as inductor 110 of FIG. 7) are better suited for different switching frequencies in order for switching power converter 306 to provide a desired output voltage $V_c(t)$. Thus, the state equation configuration profile parameters 320 can also set minimum and maximum frequencies to accommodate components used in switching power converter 306. For example, a small inductor value generally requires a higher frequency value for control signal $CS_1$ than a larger inductor value.

In at least one embodiment, the period generator 508 generates a longer period of control signal $CS_0$ for lower power requirements of load 112 as rectified, line input voltage $V_x(t)$ decreases. In at least one embodiment, the period generator 508 determines the period of control signal $CS_1$ in accordance with a spread spectrum strategy. The spread spectrum strategy adjusts the period of control signal $CS_1$, and, thus, the frequency of control signal $CS_1$, using a strategy that reduces electro-magnetic interference generated by, for example, switching power converter 306. In at least one embodiment, one or more of registers 406 include the spread spectrum strategy to spread a frequency spectrum of control signal $CS_1$ to, for example, reduce electromagnetic interference by switching power converter 306. In this embodiment, period control system 504 selects the period state signal P(n) in accordance with the spread spectrum strategy. For example, the period control system 504 can randomly select the value of period state signal P(n) within the minimum and maximum control signal frequency operational parameters.

In at least one embodiment, the period generator 508 generates a longer period of control signal $CS_0$ in accordance with a state equation operational parameter for lower power requirements of load 112 as rectified, line input voltage $V_x(t)$ decreases.

Pulse width control system 506 determines a pulse width of control signal $CS_1$ so that control signal $CS_1$ tracks the line input voltage $V_x(t)$ and minimizes any difference between the output voltage $V_c(t)$ and the reference voltage $V_{REF}$. An error generator 510 determines an error signal $e_v$ between the reference voltage $V_{REF}$ and the output voltage $V_c(t)$ by subtracting the output voltage $V_c(t)$ from the reference voltage $V_{REF}$. A proportional integrator 512 processes the error signal $e_v$ to generate proportional-integral (PI) signal $PI_{PW}$. The proportional integrator 512 adjusts the rate of response of PW and period control state machine 500 to changes in the output voltage $V_c(t)$. The PI signal $PI_{PW}$ reflects the rate adjustment. If the response is too slow, then the output voltage $V_c(t)$ may fail to track changes in power demand of load 112 and, thus, fail to maintain an approximately constant value. If the response is too fast, then the output voltage $V_c(t)$ may react to minor, brief fluctuations in the power demand of load 112. Such fast reactions could cause oscillations in PW and period control state machine 500, damage or reduce the longevity of components, or both. Thus, the particular rate of response by proportional integrator 512 is a design choice. Setting the rate of response is subsequently discussed with reference to FIG. 7.

The pulse width control system 506 also includes a pulse width generator 514 to determine a pulse width control signal T1. The pulse width generator 514 generates the pulse width control signal T1 so that the duty cycle of control signal $CS_1$ tracks the line input voltage $V_x(t)$ and, thus, provides power factor correction. In at least one embodiment, the pulse width $T_1$ of control signal $CS_1$ is determined in accordance with Control Signal State Equation [1]:

$$T1^2 = \frac{2 \cdot L}{V_{rms}^2} \cdot PI_{PW} \cdot TT \cdot \left(1 - \frac{V_x}{V_C}\right). \quad [1]$$

"T1" is the pulse width of the control signal $CS_1$ as represented by pulse width state signal PW(n). "L" represents an inductor value of PFC stage 308, such as inductor 110. "$V_{rms}$" represents the root mean square of line input voltage $V_{in}(t)$. "$PI_{PW}$" represents PI signal $PI_{PW}$, which is the output of the proportional integrator 512. "TT" is the period of control signal $CS_1$ as generated by period control system 504. In at least one embodiment, TT is the period state signal P(n). In at least one embodiment, TT is the period control signal TTC generated by period generator 508, if delta-sigma modulator 509 is not included in period control system 504 "Vx" is a sampled value of the current value of the line input voltage Vx(t). "Vc" is a sampled value of the output voltage $V_c(t)$ used to generate the PI output signal $PI_{PW}$.

In at least one embodiment, the pulse width control system 506 uses state equation configuration profile parameters 320 to respond to any number of exigencies. For example, the control state equation configuration profile parameters 320 can include a minimum line input voltage VX control state equation operational parameter for use in Equation [1] if the sample voltage Vx is below the minimum line input voltage operational parameter. If the pulse width control system 506 detects that the line input voltage $V_x(t)$ is below a predetermined threshold, which can also be set by a state equation operational parameter, the pulse width generator 514 generates a pulse width T1 of zero to effectively shut down the switching power converter 306 to prevent damaging the switching power converter 306 and/or load 112. The control state equation configuration profile parameters 320 can include a minimum output voltage $V_C$ and a maximum output voltage $V_c$ for use in Equation [1] if the sample voltage $V_C$ is below the minimum or exceeds the maximum output voltage operational parameters.

The pulse width generator 514 accesses registers 406 to retrieve state equation configuration profile parameters 320. In at least one embodiment, one of the registers 406 includes a minimum pulse width parameter. Thus, if pulse width generator 514 determines a pulse width in accordance with Equation [1] that is lower than the minimum pulse width operational parameter, pulse width control system 506 sets the pulse width of pulse width state signal PW(n) to the minimum pulse width operational parameter value. In at least one embodiment, a state equation operational parameter sets a threshold for the pulse width T1 that indicates a lower power demand by load 112. For a low power demand, the pulse width control system 506 can enter a 'pulse skipping mode' so that the pulse width T1 is zero for some pulses of controls signal $CS_1$, such as for every other pulse of control signal $CS_1$.

In at least one embodiment, the switching power converter 306 operates in discontinuous current mode. When operating in discontinuous current mode, the period generator 508 ensures that the period of control signal $CS_1$ exceeds the ramp-up and ramp-down times of inductor current $i_L$. In at least one embodiment, to ensure that switching power converter 306 operates in discontinuous current mode, an inductor L of PFC stage 308, such as inductor 110 is set in accordance with Equation [2]:

$$L = V_{min}^2 \bigg/ \left[(P_{max} \cdot J) \cdot (2 \cdot f_{max}) \cdot \left[1 - \sqrt{2}\left(\frac{V_{min}}{V_{cap}}\right)\right]\right]. \quad [2]$$

"L" is the value of the inductor of PFC stage 308. "$V_{min}$" is the root mean square (rms) minimum input voltage $V_{in}(t)$. "$P_{max}$" is the maximum power demand of load 112. The value of variable $P_{max}$ can be set as a state equation operational parameter in one of the registers 406. "J" is an overdesign factor and any value greater than 1 indicates an overdesign. In at least one embodiment, "J" is 1.1. "$f_{max}$" is a maximum frequency of control signal $CS_1$. "$V_{cap}$" is a nominal expected output voltage for load 112. In at least one embodiment, Equation [2] is not a control signal state equation because the value of the inductor L is fixed and not used by PW and period control state machine 500 to determine the period state and/or pulse width state of control signal $CS_1$.

For the inductor L value of Equation [2], in at least one embodiment, the switching power converter will operate in discontinuous current mode if the pulse width control signal satisfies Control Signal State Equations [3], [4], and [5]:

$$T1^2 = k1 \cdot k2 \cdot \left(1 - \frac{V_X}{V_C}\right) \cdot TT \cdot k3. \quad [3]$$

$$k1 = TT_{min}/J \cdot \left[1 - \sqrt{2}\left(\frac{V_{min}}{V_{cap}}\right)\right] \quad [4]$$

$$k2 = \left(\frac{V_{min}}{V_{in}(t)}\right) \quad [5]$$

"k3" is a power scale factor between 0 and 1. The remaining variables in Control Signal State Equations [3], [4], and [5] are the same as previously described. The state equation configuration profile parameters 320 include parameters to determine the pulse state of control signal $CS_1$. For example, the values of all or any subset of the variables of Control Signal State Equations [1], [3], [4], and [5] can be stored as state equation operational parameters in registers 406.

In at least one embodiment, pulse width control system 506 includes a nonlinear delta-sigma modulator 507. The nonlinear portion of the energy transfer process is associated with the energy provided to an input inductor in the PFC stage, such as inductor 110 (FIG. 7). Thus, the nonlinear delta-sigma modulator 507 is associated with power factor correction. The pulse width of the control signal $CS_1$ and the relation of the pulse width to the period of control signal $CS_1$, i.e. the duty cycle of control signal $CS_1$, controls power factor correction. Accordingly, the nonlinear delta-sigma modulator 507 is used by pulse width control system 506 to spectrally noise shape the pulse width control signal T1. The nonlinear delta-sigma modulator 310 generates the pulse width state signal PW(n) as a quantizer output signal. By removing the influence of noise from a baseband of control signal $CS_1$, the control signal $CS_1$ exercises improved control over switching power converter 306. Exemplary embodiments of the nonlinear delta-sigma modulator 507 are described in U.S. patent application Ser. No. 11/967,277 entitled "Power Control System Using A Nonlinear Delta-Sigma Modulator With Nonlinear Power Conversion Process Modeling", inventor John L. Melanson, assignee Cirrus Logic, Inc., ("Melanson V"), now U.S. Pat. No. 7,719,246 . Melanson V is incorporated herein by reference in its entireties.

Figure 6:
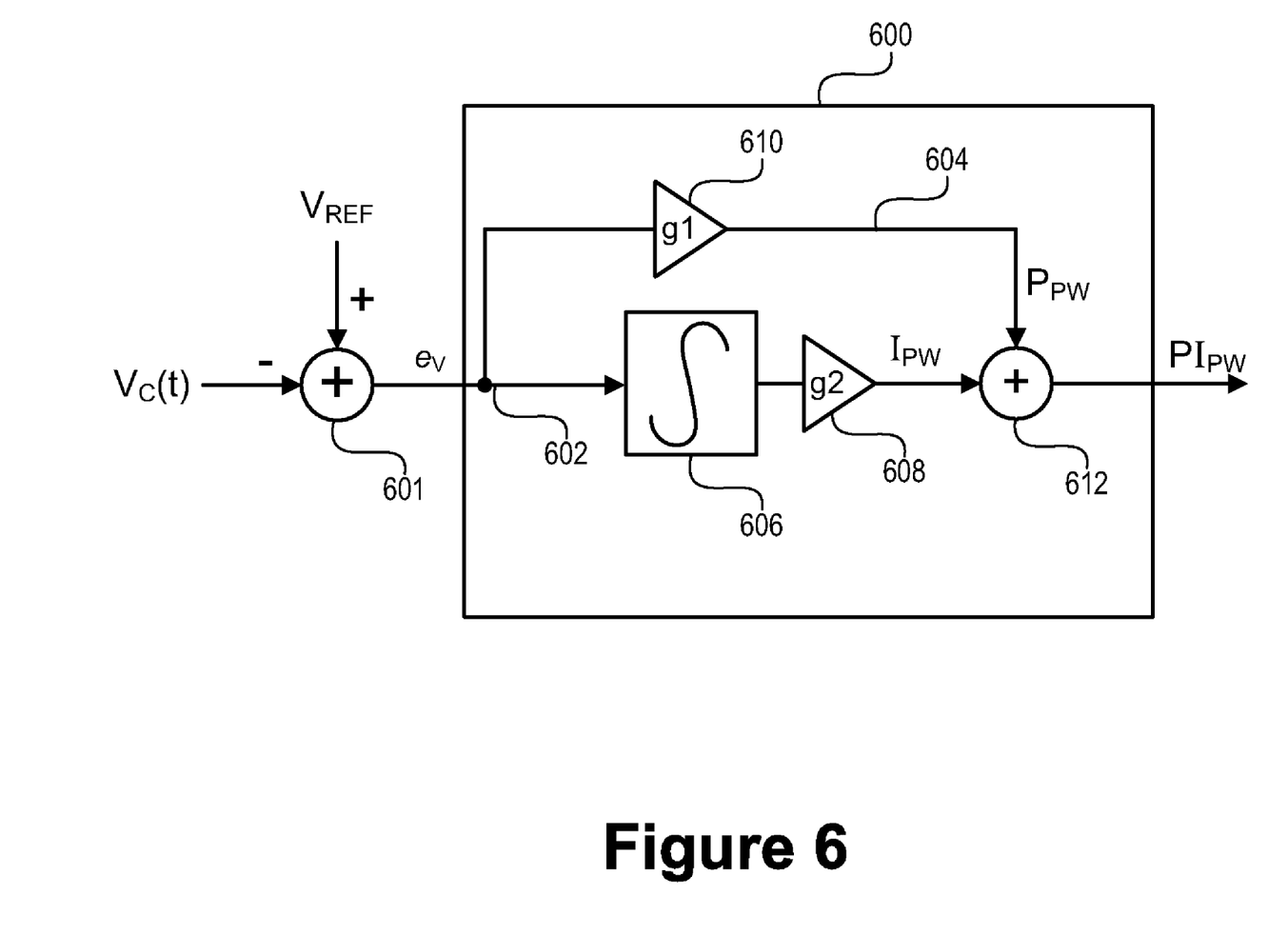
FIG. 6 depicts a proportional integrator.

FIG. 6 depicts a proportional integrator 600, which represents one embodiment of proportional integrator 512. The proportional integrator 600 generates the PI output signal $PI_{PW}$. The $PI_{PW}$ varies as the difference between the reference voltage $V_{REF}$ and the output voltage $V_c(t)$, as represented by error signal $e_v$ from error generator 601, varies. The proportional integrator 600 includes an integral signal path 602 and a proportional signal path 604. The integral signal path includes an integrator 606 to integrate the error signal $e_v$, and a gain module 608 to multiply the integral of error signal $e_v$ by a gain factor g2 and generate the integrated output signal $I_{PW}$. The proportional path 604 includes a gain module 610 to multiply the error signal $e_v$ by a gain factor g1 and generate the proportional output signal $P_{PW}$. Adder 612 adds the integrated output signal $I_{PW}$ and the proportional output signal $P_{PW}$ to generate the PI signal $PI_{PW}$.

The values of gain factors g1 and g2 are a matter of design choice. The gain factors g1 and g2 affect the responsiveness of PFC and output voltage controller 400. Exemplary values of gain factors g1 and g2 are set forth in the emulation code of Melanson III. Faster response times of the PFC and output voltage controller 400 allow the control signal $CS_1$ to more rapidly adjust to minimize the error signal $e_v$. As previously stated, if the response is too slow, then the output voltage $V_c(t)$ may fail to track changes in power demand of load 112 and, thus, fail to maintain an approximately constant value. If the response is too fast, then the output voltage $V_c(t)$ may react to minor, brief fluctuations in the power demand of load 112. Such fast reactions could cause oscillations in PFC and output voltage controller 400, damage or reduce the longevity of components, or both. Thus, the particular rate of response by proportional integrator 412 is a design choice. The gain factors g1 and g2 can be stored as part of the preprocessing and setup configuration profile parameters 322.

FIG. 7 depicts power control system 700, which represents one embodiment of power control system 300. Power control system 700 includes a switching power converter 102, which is identical to the switching power converter of power control system 100. In power control system 700, programmable PFC and output voltage controller 302 controls power factor correction and output voltage regulation of switching power converter 102.

Thus, a programmable PFC and output voltage controller includes a state machine and programmable registers containing operational parameters. The operational parameters provide the programmable PFC and output voltage controller flexibility to operate in accordance with programmable parameters, to adapt to various operating environments, and to respond to various operating exigencies.

Although the present invention has been described in detail, it should be understood that various changes, substitutions and alterations can be made hereto without departing from the spirit and scope of the invention as defined by the appended claims.

What is claimed is:

1. A programmable power factor correction (PFC) and output voltage controller to generate at least one control signal to control power factor correction of a power supply, the programmable PFC and output voltage controller comprising:
   a memory to store one or more operational parameters of the PFC and output voltage controller, wherein at least one operational parameter is a control state equation operational parameter to determine at least one member of a group consisting of a period state and a pulse width state of a power factor correction control signal;
   a pulse width and period control processor, coupled to the memory, to access each operational parameter and use each operational parameter to generate period state and pulse state output signals to respectively control period and pulse width states of the control signal; and
   a pulse width modulator, coupled to the pulse width and period control processor, to generate the control signal in accordance with the period state and pulse state output signals.

2. The programmable PFC and output voltage controller of claim 1 wherein the memory includes a first control state equation operational parameter to set a minimum frequency for the control signal and a second control state equation operational parameter to set a maximum frequency of the control signal.

3. The programmable PFC and output voltage controller of claim 1 wherein the memory includes a first control state equation operational parameter to set a minimum output voltage and a second control state equation operational parameter to set a maximum output voltage, wherein the pulse width and period control processor is configured to determine a control signal that regulates an output voltage of the power supply within the first and second state equation operational parameters.

4. The programmable PFC and output voltage controller of claim 1 wherein the memory includes a control state equation operational parameter to set a minimum input voltage operational parameter, wherein the pulse width and period control processor is configured to generate the control signal in response to an input voltage below the minimum input voltage operational parameter.

5. The programmable PFC and output voltage controller of claim 1 wherein the memory includes a control signal spread spectrum strategy operational parameter, and the pulse width and period control processor is configured to generate the period state and pulse width state signals in accordance with the spread spectrum strategy.

6. The programmable PFC and output voltage controller of claim 1 wherein the memory includes a first control state equation operational parameter to set a minimum pulse width state of the control signal and a second control state equation operational parameter to set a maximum pulse width state of the control signal.

7. The programmable PFC and output voltage controller of claim 1 wherein the memory stores one or more preprocessing operational parameters that affect generation of the control signal.

8. The programmable PFC and output voltage controller of claim 7 wherein the pulse width and period control state machine includes a proportional integrator to process a power supply output voltage feedback signal, and the one or more preprocessing operational parameters include gain factors for the proportional integrator.

9. The programmable PFC and output voltage controller of claim 1 wherein the processor is a state machine.

10. The programmable PFC and output voltage controller of claim 1 wherein the memory is a nonvolatile memory.

11. The programmable PFC and output voltage controller of claim 1 wherein the memory is a one time programmable memory.

12. A method of generating at least one control signal to control power factor correction of a power supply, the method comprising:
  accessing one or more operational parameters from a memory, wherein at least one operational parameter is a control state equation operational parameter to determine at least one member of a group consisting of a period state and a pulse width state of a power factor correction control signal;
  using each operational parameter to generate period state and pulse state output signals to respectively control period and pulse width states of the control signal; and
  generating the control signal in accordance with the period state and pulse state output signals.

13. The method of claim 12 wherein the memory includes a first control state equation operational parameter to set a minimum frequency for the control signal and a second control state equation operational parameter to set a maximum frequency of the control signal, wherein the method further comprises;
  generating the control signal with a frequency included within the minimum and maximum frequency operation parameters.

14. The method of claim 12 wherein the memory includes a first control state equation operational parameter to set a minimum output voltage and a second control state equation operational parameter to set a maximum output voltage, the method further comprising:
  determining a control signal that regulates an output voltage of the power supply within the first and second state equation operational parameters.

15. The method of claim 12 wherein the memory includes a control state equation operational parameter to set a minimum input voltage operational parameter, the method further comprising:
  generating the control signal in response to an input voltage below the minimum input voltage operational parameter.

16. The method of claim 12 wherein the memory includes a control signal spread spectrum strategy operational parameter, the method further comprising:
  generating the period state and pulse width state signals in accordance with the spread spectrum strategy.

17. The method of claim 12 wherein the memory includes a first control state equation operational parameter to set a minimum pulse width state of the control signal and a second control state equation operational parameter to set a maximum pulse width state of the control signal.

18. The method of claim 12 wherein the memory stores one or more preprocessing operational parameters that affect generation of the control signal.

19. The method of claim 18 wherein one or more preprocessing operational parameters include gain factors for the proportional integrator, the method further comprising:
  generating a proportional integral of an output voltage feedback signal of the power supply using the operational parameter gain factors.

20. The method of claim 12 wherein the memory is a nonvolatile memory.

21. The method of claim 12 wherein the memory is one time programmable memory.

22. An apparatus for generating at least one control signal to control power factor correction of a power supply, the apparatus comprising:
  means for accessing one or more operational parameters from a memory, wherein at least one operational parameter is a control state equation operational parameter to determine at least one member of a group consisting of a period state and a pulse width state of a power factor correction control signal;
  means for using each operational parameter to generate period state and pulse state output signals to respectively control period and pulse width states of the control signal; and
  means for generating the control signal in accordance with the period state and pulse state output signals.

* * * * *